(12) United States Patent
Graham et al.

(10) Patent No.: US 7,610,519 B1
(45) Date of Patent: Oct. 27, 2009

(54) VECTOR GENERATION FOR CODES THROUGH SYMMETRY

(75) Inventors: Jeffrey A. Graham, Edinburgh (GB); Ben J. Jones, Edinburgh (GB)

(73) Assignee: XILINX, Inc., San Jose, CA (US)

( * ) Notice: Subject to any disclaimer, the term of this patent is extended or adjusted under 35 U.S.C. 154(b) by 704 days.

(21) Appl. No.: 11/368,128

(22) Filed: Mar. 3, 2006

(51) Int. Cl.
*G06F 11/00* (2006.01)
*G11C 29/00* (2006.01)
*H03M 13/00* (2006.01)

(52) U.S. Cl. .................. 714/701; 714/702; 714/781

(58) Field of Classification Search ............... 714/701, 714/702, 781
See application file for complete search history.

(56) References Cited

U.S. PATENT DOCUMENTS

| | | | | |
|---|---|---|---|---|
| 5,107,503 A | * | 4/1992 | Riggle et al. ............... | 714/784 |
| 5,136,592 A | * | 8/1992 | Weng ........................ | 714/762 |
| 5,657,331 A | * | 8/1997 | Metzner et al. ............ | 714/762 |
| 6,018,990 A | * | 2/2000 | Ueki .......................... | 73/104 |
| 6,760,880 B1 | * | 7/2004 | Ofek et al. ................. | 714/758 |

OTHER PUBLICATIONS

Xilinx, Inc.; U.S. Appl. No. 11/388,267 by Graham et al. filed Mar. 24, 2006.

* cited by examiner

*Primary Examiner*—Jacques H. Louis-Jacques
*Assistant Examiner*—John J Tabone, Jr.
(74) *Attorney, Agent, or Firm*—W. Eric Webostad

(57) ABSTRACT

Apparatus for vector generation is described. A vector generator is associated with a discrete power series symmetric about at least one term and configured to provide vectors, such as QSvectors for a Turbo Code for example. The vectors are each provided in separate portions as a first portion and a second portion. The second portion of a vector of the vectors is generated from the first portion of the vector using symmetry about the at least one term.

18 Claims, 6 Drawing Sheets

VECTOR GENERATION FOR CODES THROUGH SYMMETRY

FIELD OF THE INVENTION

One or more aspects of the invention relate generally to coding and, more particularly, generation of a portion of the vectors associated with a discrete power series and providing another portion of the vectors by use of symmetry.

BACKGROUND OF THE INVENTION

Error-correcting codes are well known. One form of error-correcting code is a Turbo Code. There are various forms of Turbo Codes. However, it should be appreciated that although Turbo Codes are described, other types of error-correcting codes based on use of a discrete power series having symmetry about at least one term may be used. Notably, the terms "code," "codes," and "coding" as used herein may refer to either or both encoding and decoding.

Turbo Code encoders and decoders conventionally include an interleaver. These interleavers may be premised on use of prime numbers, and are sometimes referred to as "Prime Interleavers." Such interleavers may also be referred to as Turbo Interleavers. Use of Turbo Interleavers is called for by various organizations, including the 3rd Generation Partnership Project ("3GPP") and Universal Mobile Telecommunications System ("UMTS"), among other known organizations.

As suggested by 3GPP, a Turbo Interleaver may be implemented as a number of offset indices into a single discrete power series ("the Svector"). For implementation of such a Turbo Interleaver, a number of discrete power series ("QSvectors") may be obtained from the Svector and used to generate read addresses. Depending on blocksize of the Turbo Code interleave, the QSvectors may for example be 5, 10, or 20 discrete power series, or sub-series with respect to the Svector. Unfortunately, generating such a single series and such offset indices may be a time-consuming calculation as well as consuming a substantial amount of memory.

Furthermore, multi-channel Turbo Interleaver likewise uses QSvectors; however, such a multi-channel Turbo Interleaver may generate interleave read addresses at multiple locations within an interleave read address sequence. As discrete power series for Turbo Codes may be pseudo random, computing multiple locations in the QSvectors may be time consuming.

Accordingly, it would be both desirable and useful to provide means that reduces one or more of the above-described obstacles to vector generation from a discrete power series symmetric about at least one term.

SUMMARY OF THE INVENTION

One or more aspects of the invention relate generally to coding and, more particularly, generation of a portion of the vectors associated with a discrete power series and providing another portion of the vectors by use of symmetry.

An aspect of the invention is an interleaver, including a read address generator. The read address generator including: a vector generator associated with a discrete power series symmetric about at least one term and configured to provide vectors. The vectors each being provided in separate portions as a first portion and a second portion; and the second portion of a vector of the vectors is generated from the first portion of the vector using symmetry about the at least one term.

Another aspect of the invention is an apparatus for use associated with multi-channel interleaved data. The apparatus includes a vector generator configured to provide a first portion of each of a plurality of vectors, where the vectors are associated with a discrete power series for a type of error-correcting code. The discrete power series is symmetric about at least one term. Term manipulation circuitry is coupled to receive the first portion and configured to provide a second portion of each of the vectors responsive to the first portion of each of the vectors using symmetry about the at least one term of the discrete power series.

Yet another aspect of the invention is an apparatus for use in error-correcting code using terms of a discrete power series, including: a vector generator configured to provide either a top half or a bottom half of the terms of the discrete power series and configured to provide location information with the terms as respective first term and location pairs. The top half and the bottom half of the discrete power series are on opposite sides of a term of symmetry of the discrete power series. Control circuitry is coupled to the vector generator to receive the first term and location pairs and configured to provide respective compared versions of the first term and locations pairs as second term and location pairs using symmetry about at least one term of the discrete power series.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
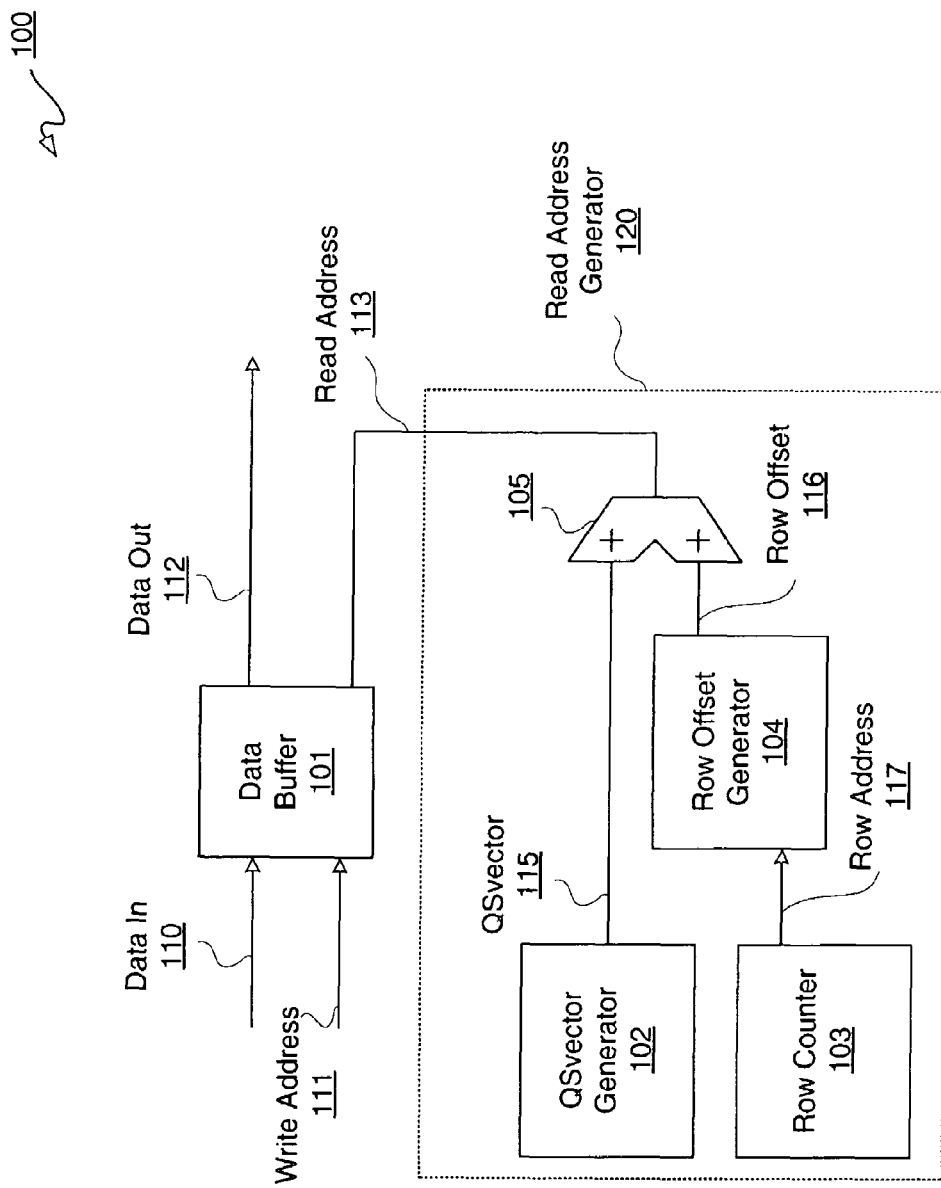
FIG. 1 is a block/schematic diagram depicting an exemplary embodiment of an interleaver.

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different. Furthermore, for purposes of clarity single lines and schematic or block instances of circuits are illustratively shown; however, it shall be appreciated from the following description that multiples of such lines and schematic or block instances of circuits may be used as may vary from application to application.

A discrete power series may be described by the Equation:

$$(x^i \bmod p) | i \in R_{p-2}, \quad (1)$$

(i.e., $\{1, (x \bmod p), (x^2 \bmod p), \ldots, (x^i \bmod p), \ldots, (x^{p-2} \bmod p)\}$), where p is a prime number, and x is a primitive root of p. For example, where p=7 and x=3, the discrete power series would be $\{1,3,2,6,4,5\}$.

The following description is for a Turbo Code Interleaver ("Turbo Interleaver"); however, it should be appreciated that any error-correction code using a discrete power series having symmetry about at least one term may be used. The Svector is the discrete power series which may be described by the Equation:

$$(\upsilon^i \bmod p) | i \in R_{p-2}, \qquad (2)$$

(i.e., $\{1, (\upsilon^2 \bmod p), (\upsilon^2 \bmod p), \ldots, (\upsilon^i \bmod p), \ldots, (\upsilon^{p-2} \bmod p)\}$), where p is a prime number, and u is a primitive root of p. For example, for p=7 and $\upsilon$=3, the Svector would be $\{1,3,2,6,4,5\}$.

The Turbo Interleaver QSvectors are the sequence of discrete power series which may be described by the sequence of Equations;

$$\{\{((Q_j \cdot \upsilon)^i \bmod p) | i \in R_{p-2}\} | j \in R_N\}, \qquad (3)$$

(i.e., $\{\{1, (Q_0 \cdot \upsilon \bmod p), (Q_0 \cdot \upsilon^2 \bmod p), \ldots, (Q_0 \cdot \upsilon^i \bmod p), \ldots, (Q_0 \cdot \upsilon^{p-2} \bmod p)\}, \{1, (Q_1 \cdot \upsilon \bmod p), (Q_1 \cdot \upsilon^2 \bmod p), \ldots, (Q_1 \cdot \upsilon^i \bmod p), \ldots, (Q_1 \cdot \upsilon^{p-2} \bmod p)\}, \ldots, \{1, (Q_N \cdot \upsilon \bmod p), (Q_N \cdot \upsilon^2 \bmod p), \ldots, (Q_N \cdot \upsilon^i \bmod p), \ldots, (Q_N \cdot \upsilon^{p-2} \bmod p)\}\}$), where p is a prime number, $\upsilon$ is a primitive root of p, N is the number of rows in the Turbo Interleaver, and $Q_N$ is a sequence of N prime numbers co-prime to (p−1). For example, for p=7, $\upsilon$=3, N=5, and Q=$\{1,7,11,13,17\}$, the QSvectors would be $\{\{1,3,2,6,4,5\}, \{1,3,2,6,4,5\}, \{1,5,4,6,2,3\}, \{1,3,2,6,4,5\}, \{1,5,4,6,2,3\}\}$.

What follows is a description of using symmetry of a discrete power series, namely the Svector in the example, to reduce computation time of at least one discrete power series or to reduce the storage space for producing at least one discrete power series, or a combination thereof.

A discrete power series as expressed in Equation (1) is symmetric about the (p−1)/2th term which is p−1 ("the term of symmetry"). Thus, one half of such a discrete power series on one side of the term of symmetry may be determined with normal computation effort, and the other half of such a discrete power series on the other side of the term of symmetry may be determined with reduced computation effort by effectively multiplying such other half by the term of symmetry. Although the following description uses symmetry about −1, it should be appreciated that other symmetries, such as for example symmetries about −i, +i, 2, Sqrt(2), or ½, may be used. Such other symmetries may vary from application to application depending on the power series.

Using Fermat's Little Theorem, the pth term in a discrete power series, $\alpha^{p-1} \bmod p$, is equal to 1. The term at the position ((p−1)/2+1) has the property that $\alpha^{(p-1)/2} * \alpha^{(p-1)/2} = 1$. Thus, the term at the position ((p−1)/2+1) is the square root of 1 and not equal to 1, and hence the term ((p−1)/2+1) is equal to −1.

A term in a power series may be multiplied by another term in the power series. After such multiplication, the positions of the multiplied terms may be added. Because it is known that the middle position is −1, one half of the power series is equal to the other half of the power series as symmetric about −1, when one of the halves is multiplied by −1. The (p−1) term is always divisible by 2 because every prime number is odd. However, not every (p−1) term is evenly divisible by 4. Thus, every power series is symmetric about the value −1, but (p−k), for k an integer other than 1, may not be evenly divisible by 4. Thus, depending on the value of k, other values may or may not be used as references for symmetry of a power series.

Again, it should be appreciated that the following description is applicable to the computation, as well as storage, of any arbitrary discrete power series having symmetry about a value. Thus, even though the following description is a discrete power series computed for a 3GPP Turbo Interleaver, it should be appreciated that it applies to the valuation of any arbitrary discrete power series. Again, even though the symmetry about −1 is described, it should be appreciated that other symmetries about other values may be used.

For an interleaver described below using symmetry, only a first half of the terms of an Svector and each QSvector therefrom may be computed, where the second half of the terms of an Svector and each QSvector therefrom may be generated using the first half effectively multiplied by the term of symmetry. Thus, for example, a Turbo Interleaver may compute and store generally just the first half of a vector, as the second half of such a vector may be generated using the negative symmetry of a discrete power series. However, it should be appreciated that by using negative symmetry of a discrete power series for direction evaluation of either the QSvector or the Svector, the Qindex need not be used.

As described above, a discrete power series may be symmetric about a term. For example, consider the discrete power series:

$$\{((x^i) \bmod P)_{i=0:P-2}\}, \qquad (4)$$

Notably, the terms "p" and "P" as used herein are the same prime number. The discrete power series in Equation (4) has a negative symmetry of $$\{((x^i) \bmod P)_{i=0:(P-1)/2}, ((-x^i) \bmod P)_{i=0:(P-1)/2}\}. \qquad (5)$$

The negative symmetry of an ith term of this discrete power series may be expressed:

$$((x^i) \bmod P) = ((-x^{|i-(P-1)/2|}) \bmod P), \qquad (6)$$

For any arbitrary discrete power series of the form:

$$\{X^0, X^1, X^2, \ldots, X^{(p-3)/2}, X^{(p-1)/2}, X^{(p+1)/2}, X^{(p+3)/2}, \ldots, X^{(p-2)}\} \qquad (7)$$

the discrete power series of Equation (7) may be rewritten in terms of $X^{(p-1)/2}$. Thus, the form of the rewritten power series may be expressed as:

$$\{X^0, X^1, X^2, \ldots, X^{(p-3)/2}, X^{(p-1)/2} * X^0, X^{(p-1)/2} * X^1, X^{(p-1)/2} * X^2, \ldots, X^{(p-1)/2} * X^{(p-3)/2}\}. \qquad (8)$$

Again, recalling that Fermat's Little Theorem states that $X(P=1) \bmod P=1$, and implies that $X^{(p-1)/2} = \sqrt{1} = \pm 1$. For each number from $X^0$ to $X^{(p-2)}$ being unique and $X^0$ equal to +1, this implies that $X^{(p-1)/2}$ equals −1. Accordingly, the discrete power series of Equation (8) may be rewritten with $X^{(p-1)/2}$ replaced by −1. In other words, the power series of Equation (8) above may be rewritten as:

$$\{X^0, X^1, X^2, \ldots, X^{(p-3)/2}, -1*X^1, -1*X^2, \ldots, -1*X^{(p-3)/2}\}. \qquad (9)$$

Accordingly, $$(X^I \bmod P) = -(X^{|I+(p-1)/2|} \bmod P), \qquad (10)$$

or the Ith term in the discrete power series is equal to −1 times the |I−(p−1)/2|th term in the discrete power series.

An example of applying the symmetry of discrete power series of the Turbo Code Svector and Turbo Code QSvectors follows. Assuming p=7, $\upsilon$=3, N=5, and Q=$\{1,7,11,13,17\}$, the QSvectors could be expressed as $\{\{1,3,2,6,4,5\}, \{1,3,2,$ 6,4,5}, {1,5,4,6,2,3}, {1,3,2,6,4,5}, {1,5,4,6,2,3}}. These QSvectors may be re-expressed as: {{1,3,2,-1,-3,-2}, {1,3,2,-1,-3,-2}, {1,5,4,-1,-5,-4}, {1,3,2,-1,-3,-2}, {1,5,4,-1,-5,-4}}. Similarly where p=7 and υ=3, the Svector could be expressed as {1,3,2,6,4,5}, and this Svector may be re-expressed as: {1,3,2,-1,-3,-2}. Notably, in both the expression of the QSvectors and the Svector both positive and negative values appear for each. Thus, generally multiplication by a negative term may be used to obtain one half of each of such vectors.

Referring to FIG. 1, there is shown a block/schematic diagram depicting an exemplary embodiment of an interleaver. In this example, interleaver 100 is a Turbo Interleaver. Though a Turbo Interleaver 100 is used as an example, it should be appreciated that other known forms of error-correction interleavers using a discrete power series symmetric about at least one term may be used.

Turbo Interleaver 100 includes data buffer 101 and read address generator 120. Interleaver data and associated write address information is provided to data buffer 101 via data signal 110 and write address signal 111, respectively. Data provided to data buffer 101 is stored in data buffer 101 in association with write address information provided via write address signal 111. Stored data in data buffer 101 is read out responsive to read address information provided via read address signal 113 to provide interleaved output data via output data signal 112.

Turbo Interleaver 100 may permutate data stored in data buffer 101 by reading out such stored data responsive to read address signal 113 in a non-sequential manner with reference to write information provided via write address signal 111. QSvectors 115 are used to provide read addresses via read address signal 111 to provide such reordering, as described below in additional detail with reference to read address generator 120.

Read addresses provided via read address signal 113 are generated by read address generator 120. Read address generator 120 includes QSvector generator 102, row counter 103, row offset generator 104, and adder 105. QSvector generator 102 generates a number of QSvectors, for example groups of 5, 10, or 20 QSvectors, which may be provided via QSvector signal 115. It should be appreciated that the number of QSvectors generated may vary from application to application.

Such QSvectors may be provided one at a time via QSvector signal 115 to an input of adder 105. Row counter 103 provides row addresses via row address signal 117 to row offset generator 104. Row addresses provided to row offset generator 104 are used to provide row offsets via row offset signal 116. Row offsets may be provided as another input to adder 105. The addition of each QSvector with an associated row offset by adder 105 is used to provide read addresses for read address signal 113 for data buffer 101.

Figure 2:
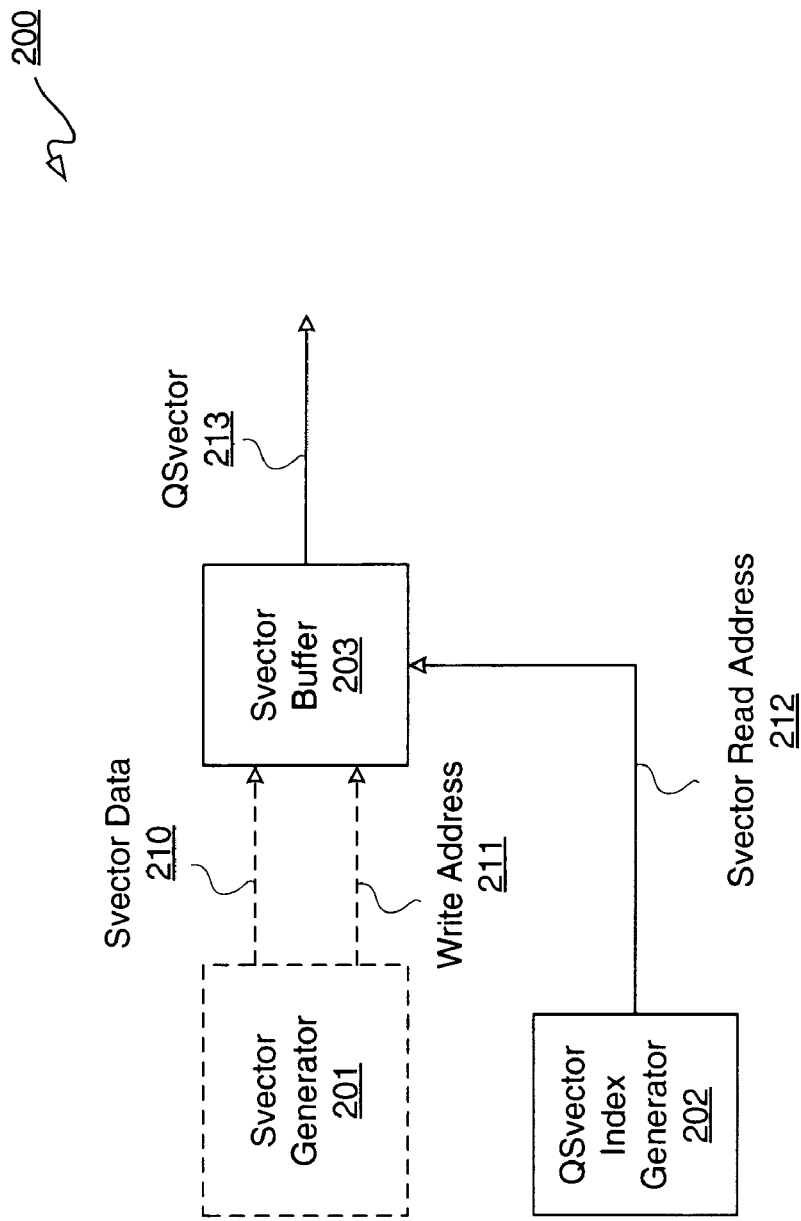
FIG. 2 is a block/schematic diagram depicting an exemplary embodiment of a QSvector generator with an Svector buffer.

Referring to FIG. 2, there is shown a block/schematic diagram depicting an exemplary embodiment of a QSvector generator 200. QSvector generator 200 may be used to provide QSvector generator 102 of Turbo Interleaver 100 of FIG. 1. In this exemplary implementation, QSvector generator 200 uses an intermediate buffer ("Svector buffer") 203. The term "intermediate" indicates that Svector buffer 203 is used prior to data buffer 101 of FIG. 1. QSvector generator 200, in addition to Svector buffer 203, includes QSvector index generator 202 and optionally may include Svector generator 201.

Svector generator 201 optionally may be used to provide Svector data via Svector data signal 210 and associated write address information ("Svector write addresses") via Svector write address signal 211 to Svector buffer 203. As shall become more apparent with the description of FIGS. 5 and 6, Svector generator 201 and Svector buffer 203 may take advantage of symmetry of Svector terms to reduce computational time and Svector storage size, respectively. Svector generator 201 may be used to provide half the terms, namely the terms to one side of a term of symmetry, of an Svector.

Thus, terms on one side of a term of symmetry of an Svector may be buffered in Svector buffer 203. Terms on the other side of the term of symmetry of an Svector may be generated from the stored terms. Alternatively, rather than generating Svector data with Svector generator 201, terms on one side of a term of symmetry of an Svector may be pre-calculated and stored in Svector buffer 203. In this later implementation, Svector generator 201 may be omitted. However, in either implementation, Svector buffer 203 may only have to store approximately half of the terms of a discrete power series to generate QSvectors, which themselves are discrete power series generated from the Svector.

QSvector index generator 202 is used to generate a sequence of QSvector indices, which may be provided to Svector buffer 203 as Svector read addresses via Svector read address signal 212. Accordingly, Svector buffer 203 may read stored Svector terms respectively responsive to QSvector indices. As described below in additional detail, by comparing or otherwise arithmetically processing an Svector read address provided via Svector read address signal 212, to a term of symmetry of a discrete power series evenly divisible by an even number, such as two for example, it may be determined on which side of the term of symmetry Svector data is to be applied to provide half the values of a QSvector.

Thus, for example, a bottom of a QSvector may be obtained immediately followed by converting the bottom portion to a top portion. The bottom and top portions may then be output as a QSvector. Thusly, each QSvector may be streamed out of Svector buffer 203 as QSvector output 213. Thus, QSvectors may be output one at a time from Svector buffer 203 responsive to QSvector indices by multiplexing bottom and top portions to provide such output. Notably, the order in which Svector terms are written to Svector buffer 203 may be different than the order in which such Svector terms are read out of Svector buffer. Furthermore, QSvector output 213 from Svector buffer 203 may be QSvector signal 115 of FIG. 1.

Figure 3:
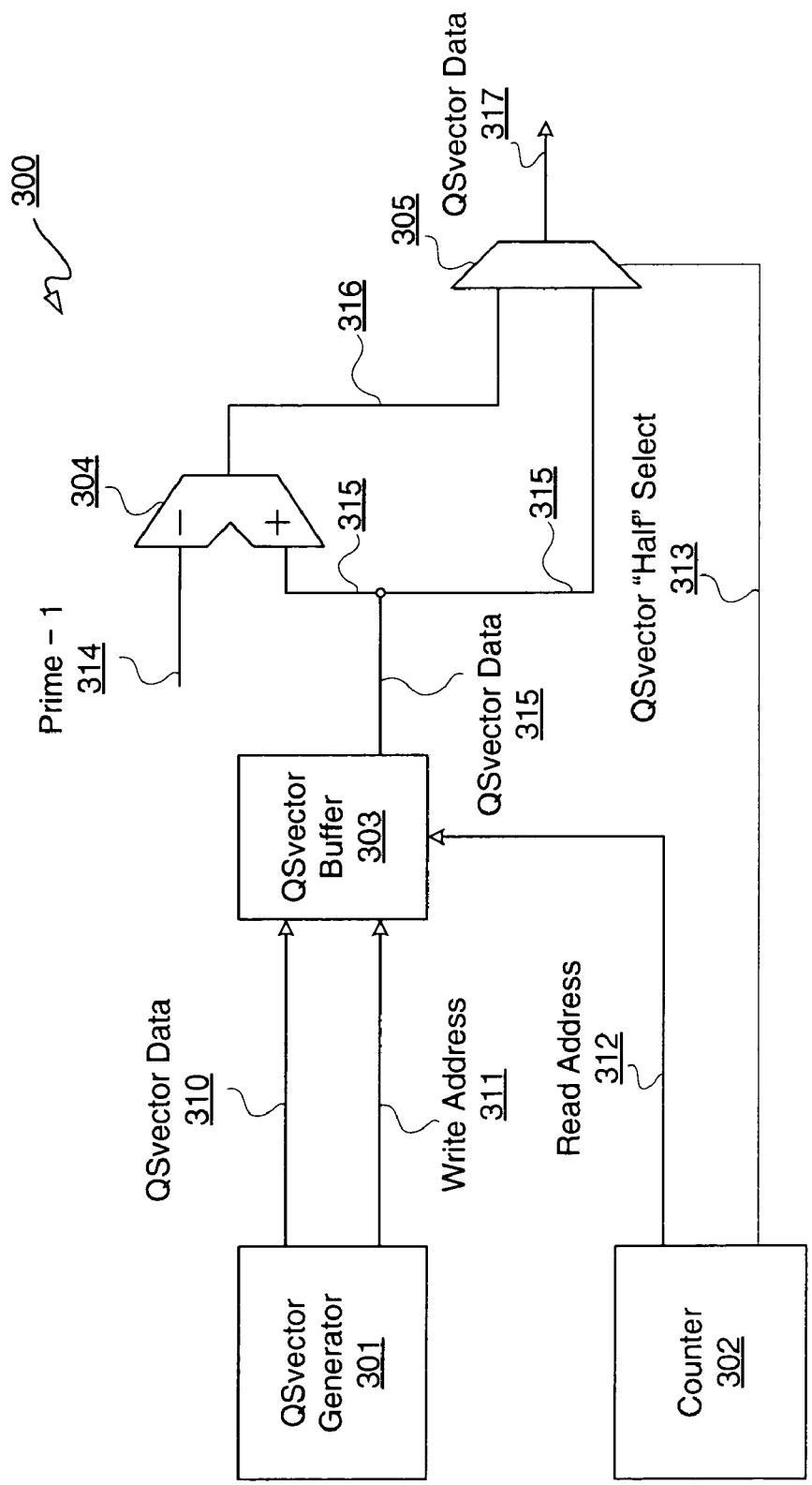
FIG. 3 is a block/schematic diagram depicting an exemplary embodiment of a QSvector generator with a QSvector buffer.

Referring to FIG. 3, there is shown a block/schematic diagram depicting an exemplary embodiment of a QSvector generator 300. QSvector generator 300 may be used for QSvector generator 102 of Turbo Interleaver 100 of FIG. 1. In this exemplary implementation, QSvector generator 300 uses an intermediate QSvector buffer 303. In addition to QSvector buffer 303, QSvector generator 300 includes QSvector generator 301, counter 302, multiplexer 305, and subtractor 304. Counter 302, multiplexer 305, and subtractor 304 may be considered control logic of QSvector generator 300.

QSvector generator 301 computes a bottom portion of each of the QSvectors one at a time for output via QSvector data signal 310. Thus, a bottom half of each QSvector associated with a bottom half of an Svector with respect to a term symmetry thereof, may be computed and output by QSvector generator 301. In this example, the bottom half is from 0 to $R*(p-3)/2)$ (e.g., $R*(0$ to $(p-3)/2))$. QSvector generator 301 provides QSvector data via QSvector data signal 310 and associated therewith provides QSvector write address information ("write addresses") via write address signal 311.

QSvector data and QSvector write address information is provided to QSvector buffer 303, meaning that only half of each QSvector is buffered. QSvector data is stored in QSvector buffer 303 responsive to QSvector write address information 311. After QSvector buffer 303 has been loaded with a bottom portion of each QSvector, QSvectors may be generated therefrom.

In this example, QSvector data is written into QSvector buffer 303 sequentially and read out therefrom sequentially. However, QSvector data need not be written sequentially to QSvector buffer 303, and still may be read out of QSvector buffer 303 sequentially. Moreover, in this example, a bottom half of each QSvector is output followed by a top half of each QSvector; however, the top and bottom halves may be reversed in order of output.

Counter 301 may output a sequential count, which may be provided to QSvector buffer 303 as QSvector read addresses via QSvector read address signal 312. QSvector read addresses are provided to QSvector buffer 303 for reading out QSvector data stored therein. QSvector data is read out in this example sequentially from QSvector buffer 303 as QSvector data 315. In this exemplary implementation, counter 302 counts from 0 to $2R*((p-3)/2)$ (e.g., $2R*(0$ to $(p-3)/2))$ to sequentially read out QSvector data 315. QSvector data 315 may be provided to a plus data input port of subtractor 304 and to a data input port of multiplexer 305.

After completing a half sequence, such as from 0 to $2R*((p-3)/2)$, counter 301 counts another half sequence, namely for example recounting from 0 to $2R*((p-3)/2)$ whether counting up or down, but this cycle is for providing a top portion of each QSvector, namely "negative" QSvector data 316. Stored QSvector data in QSvector buffer 303 has negative or positive values. If negative values are stored, the "negative" QSvector data may actually have positive values. Thus, "negative" QSvector data 316 refers to the manner of providing the data, and not the actual sign of the data values.

For generating the top half of each QSvector, subtracted from QSvector data 315 read out, responsive to the recounting by counter 302, is a (p−1) input 314 which is provided to a minus data input port of subtractor 304. Subtraction of (p−1) input 314 from QSvector data 315 is equivalent to multiplication by (−mod p). Accordingly, output of subtractor 304 is "negative" QSvector data 316, which may be output as the top portion of each QSvector. Notably, rather than a subtractor 304, a multiplier may be used to provide a multiplication by (−mod p).

Counter 302, in addition to generating QSvector read addresses 312 for reading out QSvector data 315 from QSvector buffer 303, as previously described, may generate a QSvector half select signal 313 for multiplexer 305. QSvector half select signal 313 indicates whether either a count sequence or recount sequence cycle of counter 302 is in use, as described above for outputting a sequence of either a bottom half or a top half of each QSvector to provide QSvector output 317. It should be noted that QSvector data 317 may be QSvector signal 115 of FIG. 1.

In this example, QSvector data 315 is selected by multiplexer 305 responsive to select signal 313 to provide bottom half QSvector data for QSvector output 317 on a count sequence cycle of counter 302. Moreover, in this example, negative QSvector data 316 is selected by multiplexer 305 responsive to select signal 313 to provide top half QSvector data for QSvector output 317 on a recount sequence cycle of counter 302. This toggling of QSvector half select signal 313 may of course may be repeated.

Accordingly, it should be appreciated that clock cycles used to pre-load QSvector buffer 303 with QSvector data 310 may be approximately half the number of cycles used to fill an equivalent QSvector full buffer. Similarly, buffer size associated with QSvector buffer 303 for storing QSvector data 310 may be approximately half that used to store full QSvector data.

Figure 4:
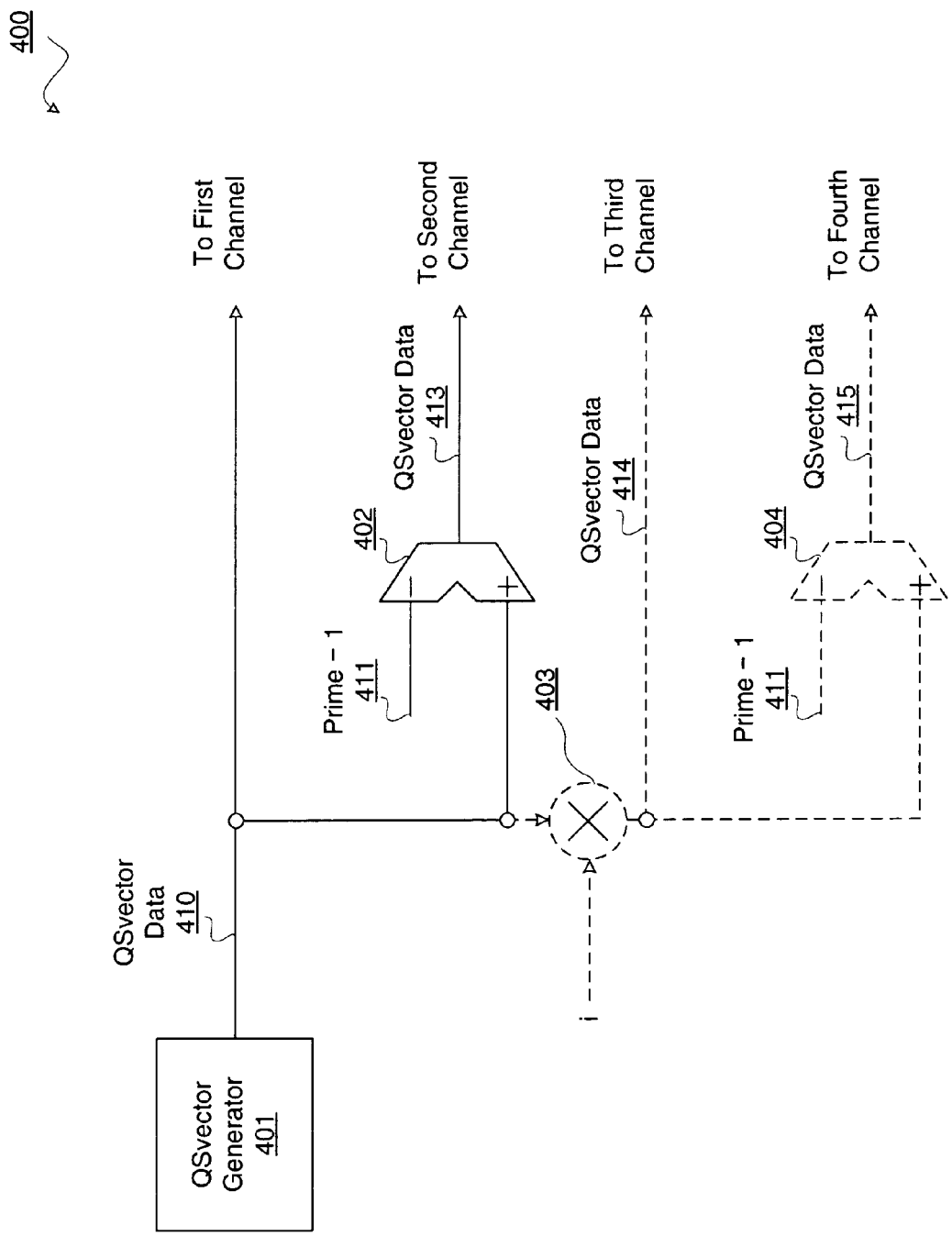
FIG. 4 is a block/schematic diagram depicting an exemplary embodiment of a multi-channel QSvector generator.

Referring to FIG. 4, there is shown a block diagram depicting an exemplary embodiment of a multi-channel QSvector generator 400. Multi-channel QSvector generator 400 may be used in a multi-channel Turbo Interleaver application for example. Multi-channel QSvector generator 400 includes QSvector generator 401 and subtractor 402. Optionally, multi-channel QSvector generator 400 may include multiplier 403 and another subtractor 404.

QSvector generator 401, which may be QSvector generator 301 of FIG. 3, may be used to generate a portion of each QSvector used by a first channel. This portion for example may be associated with a bottom half of each QSvector. Thus, output of QSvector generator 401 may be QSvector data 410, which may be a data stream of a portion of QSvector data for each QSvector associated with a side, such as a bottom half, of an Svector with respect to a term of symmetry. QSvector data 410 may be directly provided to a first channel 412. For example, the terms from 0 to $[((p-1)/2)-1]$ may be calculated for each QSvector by QSvector half generator 401.

Notably, QSvector data 410 is generated sequentially. In contrast, QSvector data 310 of FIG. 3 may be provided sequentially or non-sequentially.

Another portion of each QSvector may be generated by providing a (p−1) input 411 to subtractor 402, along with QSvector data 410. Subtractor 402 outputs negative OSvector data 410, namely QSvector data 413, for a second channel by subtracting (p−1) input 411 from QSvector data 410. Notably, in this example implementation, there is no interim buffering.

Optionally, more than two channels may be supported by QSvector generator 401. For example, additional channels may be supported using additional symmetries about other terms, namely +i and −i, for example. Accordingly, for a portion of each QSvector to be generated for a third channel, QSvector data 410 may be multiplied by a constant modulus by multiplier 403, such as with a constant i. Output of multiplier 403 may be used as QSvector data 414 for a third channel. Accordingly, QSvector data 414 may be provided to subtractor 404 for subtracting (p−1) input 411 therefrom to provide QSvector data 415 to a fourth channel.

It should be appreciated that by multiplying QSvector data 410 by i, channel space is in effect shifted by i. Thus, a respective (p−1) subtraction may be used to provide each of QSvector data 413 and QSvector data 415, as described. Notably, depending on the number of symmetries within a QSvector series, more than four channels may be supported.

Figure 5:
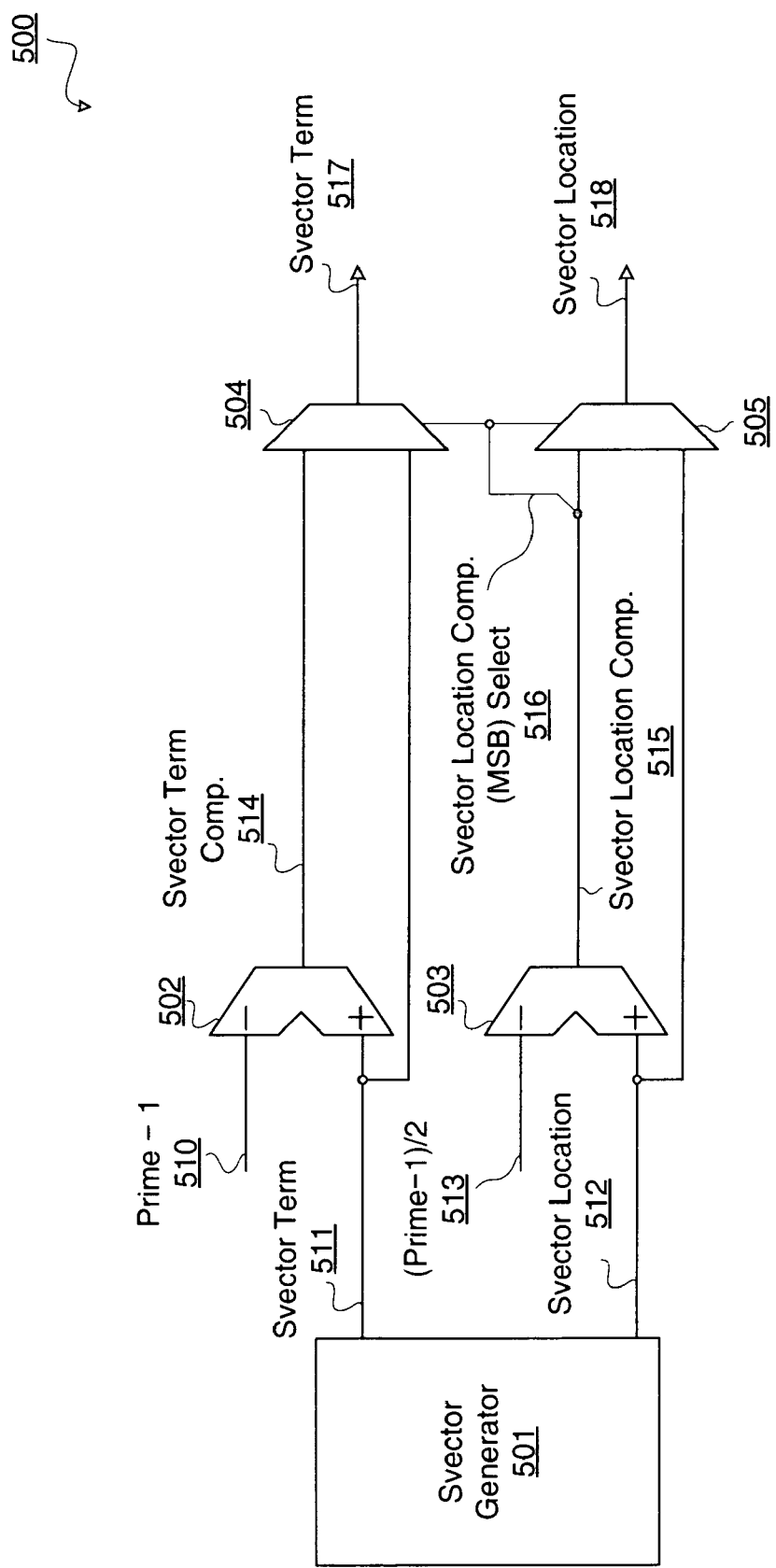
FIG. 5 is a block/schematic diagram depicting an exemplary embodiment of an Svector generator.

Referring to FIG. 5, there is shown a block/schematic diagram depicting an exemplary embodiment of an Svector generator 500. Svector generator 500 includes Svector generator 501, subtractors 502 and 503, and multiplexers 504 and 505.

Svector generator 501 computes half of the terms of an Svector, namely the half of the terms of a discrete power series to one side of a term of symmetry. These Svector terms are provided from Svector generator 501 along with a respective address via Svector term signal 511 and Svector location signal 512. Svector terms may be associated with the bottom half of an Svector for storage in Svector buffer 603 of FIG. 6.

Output of subtractor 502 is Svector term compared signal 514. An Svector term via Svector term signal 511 and (p−1) input signal 510 are provided as inputs to subtractor 502. Svector term signal 511 is further provided to an input of multiplexer 504.

Svector term compared signal 514 is determined by subtracting (p−1) via (p−1) input 510 from an Svector term of Svector term signal 511. Svector term compared signal 514 output from subtractor 502 is provided to another input of multiplexer 504. Output of multiplexer 504, which is selected as described below in additional detail, is an Svector term output 517.

Svector location signal 512 and (p−1)/2 input signal 513 are provided as inputs to subtractor 503. Svector location signal 512 is provided to an input of multiplexer 505.

Output of subtractor 503 is Svector location compared signal 515. Svector location compared signal 515 is provided to another input of multiplexer 505. Svector location compared signal 515 is obtained by subtracting (p−1)/2 of (p−1)/2 input signal 513 from an Svector location of Svector location signal 512. A Most Significant Bit ("MSB") is obtained from Svector location compared signal 515 and used as a select signal 516. Select signal 516 is used as a select signal for multiplexers 504 and 505. Output of multiplexer 505 is as Svector location signal 518.

If the MSB associated with Svector location compared select signal 516 is a logic 0, then Svector term signal 511 is selected by multiplexer 504 for output as Svector term signal 517, and Svector location signal 512 is selected by multiplexer 505 for Svector location signal 518. If, however, the MSB associated with Svector location compared select signal 516 is a logic 1, then Svector term compared signal 514 is selected by multiplexer 504 for output as Svector term signal 517, and Svector location compared signal 515 is selected by multiplexer 505 for output as Svector location signal 518.

It should be appreciated that Svector generator 501 may be Svector generator 201 of FIG. 2 to provide only half, such as a bottom half, of the terms of an Svector. Thus, Svector data signal 210 and write address signal 211 of FIG. 2 may respectively be provided as Svector term signal 511 and Svector location signal 512 of FIG. 5. However, Svector generator 500 may be used to provide either or both a top half and a bottom half of the terms of an Svector and associated addresses.

Thus, for select signal 516 being a logic 1, addresses and terms for a bottom half of the terms of an Svector, namely the terms below a term of symmetry, may be output via output signals 518 and 517, respectively. These terms may be respectively written at the addresses for populating an Svector buffer with a bottom half of the terms of an Svector, namely the terms below a term of symmetry.

Moreover, for select signal 516 being a logic 0, addresses and terms for a top half of the terms of an Svector, namely the terms above a term of symmetry, may be output via output signals 518 and 517, respectively. These terms may be respectively written at the addresses for populating an Svector buffer with a top half of the terms of an Svector, namely the terms below a term of symmetry.

Thus, Svector data signal 210 and write address signal 211 of FIG. 2 may respectively be provided as Svector term signal 517 and Svector location signal 518 of FIG. 5.

Figure 6:
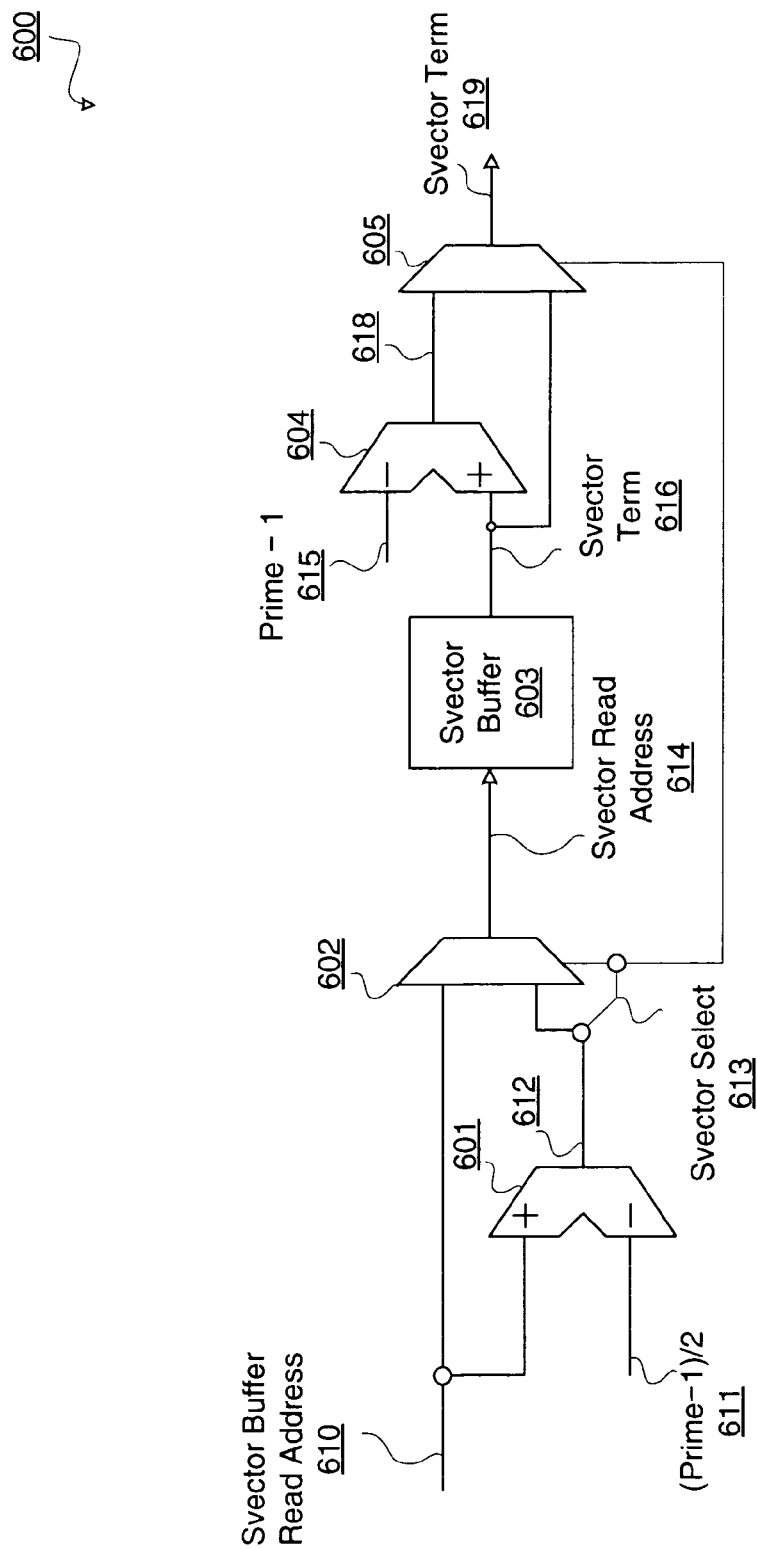
FIG. 6 is block diagram depicting an exemplary embodiment of an Svector buffer.

Referring to FIG. 6, there is shown a block/schematic diagram depicting an exemplary embodiment of an Svector buffer 600 with intermediate Svector buffer 603. In addition to Svector buffer 603, Svector buffer 600 includes subtractor 601, multiplexer 602, subtractor 604, and multiplexer 605. After an Svector generator, such as Svector generator 500 or 501 of FIG. 5, has populated Svector buffer 603 with a portion of Svector terms, namely half of the terms in an Svector to one side of a term of symmetry, Svector buffer 600 may be used to provide Svector terms via Svector terms signal 619.

Svector buffer 600 may be an implementation of Svector buffer 203 of FIG. 2. Thus, it should be understood that Svector terms provided via Svector term signal 619 may be QSvectors, and thus QSvector output 213 of FIG. 2 and may be provided as Svector term signal 619 of FIG. 6. Furthermore, Svector read address signal 212 of FIG. 2 may be Svector buffer read address signal 610 of FIG. 6.

Svector buffer read address signal 610 is provided as an input to subtractor 601 and to an input of multiplexer 602. Another input to subtractor 601 is (p−1)/2 input 611. Svector buffer read address signal 610 is compared to (p−1)/2 input 611 using subtractor 601 to produce Svector buffer read address compared signal 612. Svector buffer read address compared signal 612 is provided to another input of multiplexer 602. An MSB of Svector buffer read address compared signal 612 is obtained and used as a select signal, namely Svector select signal 613, and is provided to multiplexers 602 and 605 as a control select.

If an MSB associated with Svector buffer read address compared signal 612 is a logic 0, namely if Svector select signal 613 is a logic 0, then Svector buffer read address 610 is greater than (p−1)/2 input 611 and Svector buffer read address compared signal 612 is selected by multiplexer 602 for output as Svector buffer read address signal 614. Svector half buffer read address signal 614 is provided to Svector buffer 603 for reading data therefrom.

Conversely, if the MSB associated with Svector buffer read address compared signal 612 equals a logic 1, namely Svector select signal 613 is a logic 1, then Svector buffer read address signal 610 is selected by multiplexer 602 for output as Svector buffer read address 614.

Thus, it should be appreciated that Svector buffer read address signal 610, such as from a QSvector index generator, is for addressing any term in an Svector. However, Svector buffer 603 may store only half, such as top or bottom half, of the terms of an Svector. Thus, Svector read address signal 614 indicates whether a term associated with a top half or a bottom half of an Svector with reference to a term of symmetry used for the comparison, namely the (p−1)/2 input to subtractor 601, is to be output from Svector buffer 603. Notably, even though Svector buffer 603 may only have the bottom half of the terms of an Svector buffer, those terms may be read out of Svector buffer 603 as associated with a top half term. Such terms read out from Svector buffer 603 for a top half are multiplied by (−mod p), as described below in additional detail for output as an Svector term for a QSvector.

Svector buffer 603 outputs an Svector term via Svector term signal 616 responsive to Svector buffer read address signal 614. Svector term signal 616 is input to a plus port of subtractor 604, another input to subtractor 604 is a (p−1) input signal 615. Output of subtractor 604 is Svector term compared signal 618. Svector term signal 616 and Svector term compared signal 618 are provided as respective inputs to multiplexer 605.

If an MSB associated with Svector buffer read address compared signal 612 equals a logic 0, then Svector term compared signal 618 is selected by multiplexer 605 for output as Svector term signal 619. Conversely, if the MSB associated with Svector buffer read address compared signal 612 equals a logic 1, then Svector term signal 616 is selected by multiplexer 605 for output as Svector term signal 619. Svector terms provided via Svector term signal may be used to constitute QSvectors.

Even though generating vectors for an interleaver, such as for error correcting encoding or decoding was described, it should be appreciated vector generation may be used in other applications. For example, vector generation may be used in deciphering encrypted data.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An interleaver, comprising:
a read address generator including:
a vector generator, the vector generator associated with a discrete power series, the discrete power series being symmetric about at least one term;
the vector generator configured to provide vectors;
the vectors each being provided in separate portions as a first portion and a second portion; and
the second portion of a vector of the vectors generated from the first portion of the vector using symmetry about the at least one term.

2. The interleaver according to claim 1, further comprising:
a first buffer coupled to receive input data and first write address information;
the first buffer configured to store the input data in association with the first write address information;
the read address generator coupled to the first buffer and configured to provide first read address information to the first buffer;
the first buffer configured for outputting the input data stored as output data responsive to the first read address information; and
the first read address information being associated with the vectors.

3. The interleaver according to claim 2, wherein:
the read address generator further includes an offset generator configured to provide offset values for respective combination with the vectors;
the vectors being a number of discrete power series (QS-vectors) as associated with an error-correction code;
the discrete power series being a single discrete power series (Svector) as associated with the error-correction code; and
the read address generator configured to provide a permutated sequence of read addresses as the first read address information.

4. The interleaver according to claim 3, wherein the read address generator further includes:
an adder coupled to respectively combine the offset values with the QSvectors to provide the first read address information;
a counter coupled to the offset generator and configured to provide row addresses; and
the offset generator configured to respectively provide the offset values responsive to the row addresses.

5. The interleaver according to claim 1, wherein a subset of the vectors are provided using symmetry about at least one other term, wherein the second portion of the vectors in the subset are generated from the first portion using symmetry about the at least one other term.

6. The interleaver according to claim 1, wherein the vector generator includes:
an index generator configured to provide indices, the discrete power series being an Svector associated with an error-correction code, the vectors being QSvectors associated with the error-correction code;
a buffer coupled to receive the indices as second read address information, the buffer having stored therein a first data half of the Svector and not having stored therein a second data half of the Svector, the indices being associated with the first data half and the second data half;
the buffer configured to output terms of the Svector from the first data half stored responsive to any of the indices to provide the QSvectors; and
output control circuitry for selecting between providing the terms as stored in the buffer for output from the vector generator without using with the at least one term to manipulate the terms and with using the at least one term to manipulate the terms.

7. The interleaver according to claim 6, wherein the at least one term of the Svector divided by two is subtracted from the second read information to provide third read address information for reading the terms for output from the buffer and to provide a select bit for selecting between providing the terms for output with or without manipulation with the at least one term.

8. The interleaver according to claim 6, wherein the at least one term is a p−1 term for p a prime number; and wherein the vector generator further includes a subtractor to provide manipulation of the terms by subtracting the at least one term from each of the terms to be output.

9. The interleaver according to claim 2, wherein the vectors are QSvectors as associated with an error-correction code; and wherein the vector generator includes:
a QSvector generator configured to provide the first portion for each of the QSvectors and second write address information for the first portion of each of the QSvectors;
a second buffer coupled to receive the first portion of each of the QSvectors and the second write address information;
the second buffer configured to store the first portion of each of the QSvectors in association with the second write address information; and
control circuitry configured to provide second read address information for outputting the first portion of each of the QSvectors from the second buffer.

10. The interleaver according to claim 9, wherein the control circuitry includes:
a counter coupled to provide the second read address information to the second buffer and configured to provide a select signal;
the control circuitry configured to:
provide the second portion of each of the QSvectors, the second portion of each of the QSvectors being initially read out of the second buffer as the first portion of each of the QSvectors; and
output one of the first portion and the second portion for each of the QSvectors responsive to a first state of the select signal and to output the other one of the first portion and the second portion of each of the QSvectors responsive to a second state of the select signal.

11. The interleaver according to claim 10, wherein the control circuitry is configured to provide the second portion of each of the QSvectors by multiplying the first portion of each of the QSvectors by −1 modulus p for p a prime number.

12. The interleaver according to claim 10, wherein the first portion of each of the QSvectors is a bottom half of each of the QSvectors symmetric about the at least one term; and wherein the second portion of each of the QSvectors is a top half of each of the QSvectors symmetric about the at least one term.

13. The interleaver according to claim 9, wherein the at least one term is a p−1 term; and wherein the control circuitry includes a subtractor for subtracting the p−1 term from the first portion of each of the QSvectors to provide the second portion of each of the QSvectors.

14. An apparatus for use associated with multi-channel interleaved data, comprising:
- a vector generator configured to provide a first portion of each of a plurality of vectors, the vectors being associated with a discrete power series for a type of error-correcting code, the discrete power series being symmetric about at least one term; and
- term manipulation circuitry coupled to receive the first portion and configured to provide a second portion of each of the vectors responsive to the first portion of each of the vectors using symmetry about the at least one term of the discrete power series.

15. The apparatus according to claim 14, wherein the vectors are QSvectors; and wherein the term manipulation circuitry is configured to provide the second portion of each of the QSvectors by multiplying the first portion of each of the QSvectors by −1 modulus p for p a prime number.

16. The apparatus according to claim 14, wherein the first portion of each of the QSvectors are provided to a first channel; and
wherein the second portion of each of the QSvectors are provided to a second channel.

17. The apparatus according to claim 16, wherein the first portion of each of the QSvectors are a bottom half of each of the QSvectors; wherein the second portion of the QSvectors are a top half of each of the QSvectors; wherein the at least one term is a prime number minus 1 term; and wherein the term manipulation circuitry includes a subtractor for subtracting the prime number minus 1 term from the first portion of each of the QSvectors to provide the second portion of each of the QSvectors.

18. The apparatus according to claim 16, further comprising a multiplier coupled to receive the first portion of each of the QSvectors and configured to multiply the first portion of the QSvectors by a constant, the constant being associated with symmetry about at least one other term of the discrete power series.

* * * * *

UNITED STATES PATENT AND TRADEMARK OFFICE
CERTIFICATE OF CORRECTION

| | | |
|---|---|---|
| PATENT NO. | : 7,610,519 B1 | Page 1 of 1 |
| APPLICATION NO. | : 11/368128 | |
| DATED | : October 27, 2009 | |
| INVENTOR(S) | : Graham et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 907 days.

Signed and Sealed this

Twelfth Day of October, 2010

David J. Kappos
*Director of the United States Patent and Trademark Office*